United States Patent
Pant et al.

(10) Patent No.: US 6,492,762 B1
(45) Date of Patent: Dec. 10, 2002

(54) ULTRASONIC TRANSDUCER, TRANSDUCER ARRAY, AND FABRICATION METHOD

(75) Inventors: Bharat B. Pant, Stonybrook, NY (US); Emad S. Ebbini, Edina, MN (US); David E. Acker, Setauket, NY (US); Edward Paul Harhen, Duxbury, MA (US); Todd Fjield, Poquott, NY (US)

(73) Assignee: Transurgical, Inc., Setauket, NY (US)

( * ) Notice: Subject to any disclaimer, the term of this patent is extended or adjusted under 35 U.S.C. 154(b) by 0 days.

(21) Appl. No.: 09/532,614

(22) Filed: Mar. 22, 2000

Related U.S. Application Data

(60) Provisional application No. 60/132,347, filed on Jun. 3, 1999, and provisional application No. 60/125,676, filed on Mar. 22, 1999.

(51) Int. Cl.[7] .............................................. H01L 41/08
(52) U.S. Cl. ...................................... 310/334; 310/800
(58) Field of Search ................................ 310/334, 800, 310/328

(56) References Cited

U.S. PATENT DOCUMENTS

| | | | |
|---|---|---|---|
| 3,798,473 A | 3/1974 | Murayama et al. ............ 310/8 |
| 3,971,250 A | * 7/1976 | Taylor .......................... 73/766 |
| 4,477,783 A | 10/1984 | Glenn .......................... 333/138 |
| 4,554,925 A | 11/1985 | Young .......................... 128/653 |
| 4,620,546 A | 11/1986 | Aida et al. .................... 128/660 |
| 4,951,688 A | 8/1990 | Keren .......................... 128/804 |
| 4,985,195 A | 1/1991 | Wilson et al. ............... 264/320 |
| 4,992,692 A | 2/1991 | Dias ............................. 310/335 |
| 5,209,126 A | 5/1993 | Grahn .......................... 73/862 |
| 5,233,153 A | 8/1993 | Coats .......................... 219/121 |
| 5,247,935 A | 9/1993 | Cline et al. ............... 128/653.2 |
| 5,288,551 A | 2/1994 | Sato et al. ................... 428/334 |
| 5,321,332 A | 6/1994 | Toda .......................... 310/322 |
| 5,389,848 A | * 2/1995 | Trzaskos .................... 310/322 |
| 5,744,898 A | 4/1998 | Smith .......................... 310/334 |
| 5,834,882 A | 11/1998 | Bishop ....................... 310/359 |
| 5,844,349 A | * 12/1998 | Oakley et al. .............. 310/358 |

FOREIGN PATENT DOCUMENTS

WO     WO 98/52465     11/1998

OTHER PUBLICATIONS

IEEE UFFC (Ultrasonics Ferroelectrics and Frequency Control) symposium held in Japan (Oct. 1998), Fjield et al., Low Profile Lenses for Ultrasound Surgery.
Fjield et al., Phys. Med. Biol., 44, pp. 1803–1813 (1999), Low–profile lenses for ultrasound surgery.
*An Engineer's Guide to Flexible Circuit Technology*, by Joseph Fjelstad, Electrochemical Publications, Ltd, pp. 1–23 (1997).

(List continued on next page.)

*Primary Examiner*—Nestor Ramirez
*Assistant Examiner*—Michael C. Zarroli
(74) *Attorney, Agent, or Firm*—Lerner, David, Littenberg, Krumholz & Mentlik, LLP

(57) ABSTRACT

A multi-layer piezoelectric transducer includes a first polymeric layer of piezoelectric material having spaced apart first and second surfaces and a second polymeric layer of piezoelectric material having spaced apart first and second surfaces. A first ground layer overlies the first surface of the first polymeric layer and a second ground layer overlies the first surface of the second polymeric layer. A signal layer is sandwiched between the second surfaces of the first and second polymeric layers.

44 Claims, 7 Drawing Sheets

OTHER PUBLICATIONS

Qian Zhang, Peter A. Lewin and Philip E. Bloomfield, "PVDF Transducers—A Performance Comparison of Single–Layer and Multilayer Structures," IEEE Transactions on Ultrasonics, Ferroelectrics, and Frequency Control, vol. 44, No. 5, pp. 1148–1156 (Sep. 1997).

Richard L. Goldberg and Stephen W. Smith, "Multilayer Piezoelectric Ceramics for Two–Dimensional Array Transducers," IEEE Transactions on Ultrasonics, Ferroelectrics, and Frequency Control, vol. 41, No. 5, pp. 761–771, (Sep. 1994).

Qian Zhang and Peter A. Lewin, "Wideband and Efficient Polymer Transducers Using Multiple Active Piezoelectric Films," IEEE Ultrasonics Symposium Proceedings, vol. 2, pp. 757–760, (Oct. 31–Nov. 3, 1993).

Geoffrey R. Lockwood, Daniel H. Turnbull, and F. Stuart Foster, "Fabrication of High Frequency Spherically Shaped Ceramic Transducers," IEEE Transactions on Ultrasonics, Ferroelectrics, and Frequency Control, vol. 41, No. 2, pp. 231–235, (Mar. 1994).

Qian Zhang, Peter A. Lewin and Philip E. Bloomfield, "Variable frequency multilayer PVDF transducer for ultrasound imaging," Proceedings of SPIE, Ultrasonic Transducer Engineering, vol. 3037, pp. 2–12, (Feb. 27–28, 1997).

* cited by examiner

ULTRASONIC TRANSDUCER, TRANSDUCER ARRAY, AND FABRICATION METHOD

CROSS-REFERENCE TO RELATED APPLICATION

This application claims the benefit of: U.S. Provisional Patent Application No. 60/125,676, filed Mar. 22, 1999, entitled TRANSDUCER ARRAYS AND FABRICATION TECHNIQUES, the entire disclosure of which is incorporated herein by reference; and U.S. Provisional Patent Application No. 60/137,347, filed Jun. 3, 1999, entitled SPRAY-FABRICATED BACKINGS FOR TRANDUCER ARRAYS, the entire disclosure of which is incorporated herein by reference.

BACKGROUND OF THE INVENTION

1. Field of the Invention

The present invention relates to ultrasonic transducers and, more particularly, to ultrasonic transducer arrays, which are fabricated for low cost, disposable use.

2. Related Art

There are forms of therapy that can be applied within the body of human or other mammalian subject by applying energy to the subject. In hyperthermia, ultrasonic or radio frequency energy is applied from outside of the subject's body to heat certain body tissues. The applied energy can be focused to a small spot within the body so as to heat a particular tissue or group of tissues to a temperature sufficient to create a desired therapeutic effect. This technique can be used to selectively destroy unwanted tissue within the body. For example, tumors or other unwanted tissues can be destroyed by applying heat to the tissue and raising the temperature thereof to a level (commonly temperatures of about 60° C. to 80° C.) sufficient to kill the tissue without destroying adjacent, normal tissues. Such a process is commonly referred to as "thermal ablation." Other hyperthermia treatments include selectively heating tissues so as to selectively activate a drug or promote some other physiologic change in a selected portion of the subject's body. Additional details on the techniques employed in hyperthermia treatments for ablation are disclosed in, for example, copending, commonly assigned PCT International Publication No. WO98/52465, the entire disclosure of which is incorporated herein by reference. Other therapies use the applied energy to destroy foreign objects or deposits within the body as, for example, in ultrasonic lithotripsy.

Often, magnetic resonance imaging devices are utilized in conjunction with ultrasonic treatments so as to ensure that the proper tissues are being affected. Combined magnetic resonance and ultrasonic equipment suitable for these applications are described in greater detail in copending, commonly assigned PCT International Publication No. WO98/52465.

Existing ultrasonic energy emitting devices include piezoelectric resonance units to produce ultrasound waves. The piezoelectric resonance units typically include a substantially rigid frame to which a plurality of separate ultrasound emitting sections are connected and disposed in an array. Each ultrasound emitting section typically includes a rigid backing (such as a block of alumina, glass, or rigid polymer) and a piezoelectric film, such as a polyvinylidene fluoride (PVDF) film, on which a rear electrode is disposed such that the rear electrode is sandwiched between the rigid backing and the piezoelectric film. A front electrode is disposed on an opposite side of the piezoelectric film such that the front electrode faces away from the backing. The electrodes are formed as relatively thin conductive deposits on the surfaces of the piezoelectric film as, for example, by applying an electrically conductive ink on the piezoelectric layer or by sputtering or electroless plating, followed by electroplating.

Each ultrasound emitting section may include numerous pairs of electrodes (one electrode on each side of the piezoelectric film forming a pair) arranged in a further array as, for example, a 3×3 array. Each pair of electrodes and the portion of piezoelectric film disposed between each pair of electrodes forms an independently operable piezoelectric transducer. By applying differential voltage to the two electrodes of the pair, the region of the piezoelectric film between the electrodes can be made to expand and/or contract in a forward-to-rearward direction. Most preferably, the voltage applied to the electrodes is an alternating potential operating at an ultrasonic frequency of about 1–10 MHz, and more commonly 1.0 to 1.8 MHz. This produces a desirable ultrasonic vibration in the piezoelectric film which, in turn, produces ultrasonic waves.

It is desirable to orient the array of ultrasound emitting sections in a relatively curved shape such that a focal length of about 20 cm is obtained. Ultrasonic emitting sections of the curved variety are typically produced by forming a curved structure, often consisting of a plastic frame, and disposing the individual ultrasound emitting sections on the curved structure to produce a unit capable of emitting a focused beam. Unfortunately, this technique is relatively expensive, in part because it requires a substantial number of processing steps to produce and locate the individual ultrasound emitting sections on the curved structure.

Accordingly, there is a need in the art for a new multi-layer piezoelectric transducer structure which may be readily formed into a curved shape to achieve desirable focused ultrasound beam propagation characteristics without undue expense.

SUMMARY OF THE INVENTION

A multi-layer piezoelectric transducer according to one aspect of the present invention includes: a first polymeric layer of piezoelectric material having spaced apart first and second surfaces; a second polymeric layer of piezoelectric material having spaced apart first and second surfaces; a first ground layer overlying the first surface of the first polymeric layer; a second ground layer overlying the first surface of the second polymeric layer; and a signal layer sandwiched between the second surfaces of the first and second polymeric layers.

Advantageously, the location of the signal layer sandwiched between the polymeric layers and the ground layers result in: (i) reduced radio frequency (RF) leakage and interference with surrounding electronic circuits; and (ii) higher safety to users, technicians, and/or other foreign bodies that may inadvertently touch the transducer.

The multi-layer piezoelectric transducer may include further polymeric layers having respective ground layers and signal layers in proper interleaving fashion to achieve an overall multi-layer piezoelectric transducer of higher power. Preferably, the polymeric layers are formed from polyvinylidene fluoride (PVDF). Most preferably, the layers of the piezoelectric transducer form a curved shape (e.g., a dome) such that one of the first and second ground layers is located at an ultrasonic emission side of the curve and the other of the first and second ground layers is located at a rear side of the curve. When further polymeric layers are employed, a third, a fourth, a fifth, etc. ground layer may be located at one of the emission and rear sides of the curve.

It is preferred that a piezoelectric transducer is formed into a curved shape by plastically deforming the piezoelectric transducer. The plastic deformation may be obtained, for example, by providing a curve-shaped mold and urging the piezoelectric transducer against the mold such that it deforms into the curved shape. Pressurized gas may be used to push the piezoelectric transducer against a curve-shaped mold. Alternatively, a vacuum may be used to draw the piezoelectric transducer against the curve-shaped mold. Still another method of urging the piezoelectric transducer against a curve-shaped mold may include the steps of providing complimentary curve-shaped mold halves and pressing the piezoelectric transducer between the mold halves to deform the piezoelectric transducer into the curved shape. Preferably, the piezoelectric transducer is fixed into the curved shape using thermoforming techniques (e.g., heating the transducer sufficiently to achieve a plastic deformation state, curving the transducer, and cooling the transducer such that the curved shape is retained).

Advantageously, the piezoelectric transducer is first formed as a substantially flat structure (e.g., using printed circuit forming techniques). Then the transducer is thermally deformed to achieve the curved shape. This results in substantial cost savings and permits previously unattained degrees of freedom in the types of curved shapes which may be obtained. For example, compound curves of the piezoelectric transducer may be achieved using the methods of the present invention.

Preferably, a cured slurry of epoxy, tungsten, and at least one of boron nitride and silicon carbide are disposed at the rear side of the curve to obtain a desirable impedance mis-match at ultrasonic frequencies. Alternatively, one or both of alumina or ceramic material may be disposed at the rear side of the curve as, for example, by spraying or painting molten alumina or ceramic on or near the curve. The impedance mis-match is used to enhance power coming out of the front of the transducer.

The rear layer provides an impedance mis-match and thermal conduction. The piezoelectric layer generates heat during its operation which may be transmitted through the back and front of the transducer.

Other objects, features, and advantages will become apparent to one skilled in the art from the disclosure herein taken in conjunction with the accompanying drawings.

BRIEF DESCRIPTION OF THE DRAWINGS

For the purpose of illustrating the invention, there are shown in the drawings forms which are presently preferred, it being understood, however, that the invention is not limited to the precise arrangements and/or instrumentalities shown.

DETAILED DESCRIPTION OF THE INVENTION

Figure 1:
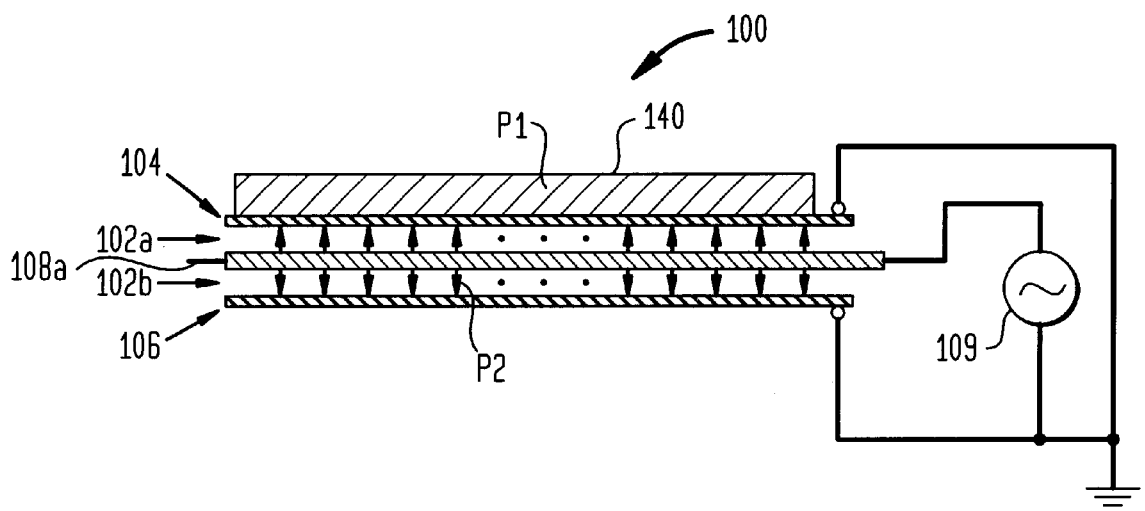
FIG. 1 is a side sectional view of a multi-layer piezoelectric transducer in accordance with one embodiment of the present invention.

Referring now to the drawings, wherein like numerals indicate like elements, there is shown in FIG. 1 a multilayer piezoelectric transducer 100 in accordance with one embodiment of the present invention. The multi-layer piezoelectric transducer 100 preferably includes a plurality of polymeric layers 102a, 102b of polymeric piezoelectric material. Each polymeric layer 102 includes spaced apart first and second (outer) surfaces on which electrodes may be disposed. Preferably, a first ground layer 104 is formed overlying a first (i.e., upper) surface of a first one of the polymeric layers 102a. A second ground layer 106 is preferably disposed overlying a first (i.e., lower) surface of a second one of the polymeric layers 102b. A signal layer 108a is preferably sandwiched between, and in communication with, the second outer surfaces of the first and second polymeric layers 102a, 102b.

The signal layer 108a may be disposed on one of the polymeric layers 102a, 102b as, for example, by applying an electrically conductive ink on its second outer surface or by sputtering or plating. The second outer surface of the other of the polymeric layers 102a, 102b may be brought into communication with the signal layer 108a by, for example, conductive epoxy or any of the known bonding compounds to produce the multi-layer, piezoelectric transducer 100. Most preferably, the first and second ground layers 104, 106 are in direct contact with the first outer surfaces of the first and second polymeric layers 102a, 102b, respectively.

The polymeric layers 102 are preferably polarized in opposing directions as shown by arrows P1 and P2. Thus, the electric field in each layer by 102a, 102b is either parallel or anti-parallel to its polarization vector. This leads to additive ultrasonic displacement in the layers 102a, 102b. In some cases, it is preferred that the multi-layer transducer 100 is flat.

Advantageously, the signal layer 108a is disposed between first and second polymeric layers 102a, 102b and, therefore, between first and second ground layers 104, 106 such that additive ultrasonic vibrations may be obtained. A further advantage is achieved when the ground layers 104, 106 are formed from a substantially continuous sheet such that RF emissions are reduced. Still further, accidental contact with the signal layer 108a is substantially prevented because the signal layer is sandwiched between the ground layers 104, 106. Indeed, when an excitation source 109 is connected to the signal layer 108a and ground layers 104, 106 as shown in FIG. 1, it is highly unlikely that a person (or foreign object) will contact the signal layer 108a. Instead, ground layers 104, 106 (at a safe neutral potential) shield the signal layer 108a.

Suitable polymeric piezoelectric materials include polyvinylidene fluoride (PVDF), and co-polymers of PVDF (such as PVDF and trifluoroethylene (TrFE)). The use of PVDF (and PVDF-TrFE, P(VDF-TrFE), in particular) as the polymeric material is most preferred.

Figure 2:
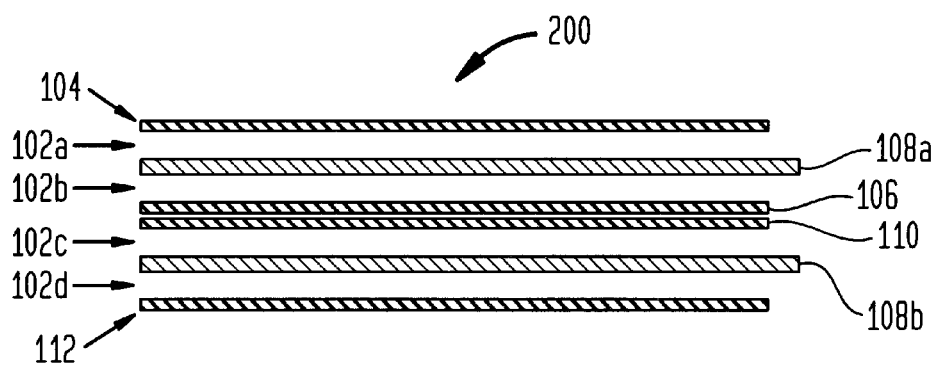
FIG. 2 is a side sectional view of a modified multi-layer piezoelectric transducer of FIG. 1 (i.e., employing additional layers)

With reference to FIG. 2, a modified multi-layer piezoelectric transducer 200 may be obtained by employing additional polymeric layers, such as a third polymeric layer 102c and a fourth polymeric layer 102d. As with layers 102a and 102b, third and fourth polymeric layers 102c and 102d include first and second (outer) surfaces on which electrodes may be disposed. In particular, a first outer surface of the third polymeric layer 102c preferably includes a third ground electrode 110, while a first outer surface of the fourth polymeric layer 102d includes a fourth ground electrode 112. Those skilled in the art will appreciate from the teaching herein that ground electrodes 106 and 110 may be substituted with a single ground electrode if desired. A second signal layer 108b is preferably sandwiched between, and in communication with, the second outer surfaces of the third and fourth polymeric layers 102c, 102d. As in the piezoelectric transducer 100 of FIG. 1, the layers 102 of transducer 200 are preferably polarized, although they are not shown as such for clarity.

Advantageously, the multi-layer piezoelectric transducer 200 of FIG. 2 enjoys the advantages of the multi-layer piezoelectric transducer 100 of FIG. 1, with the additional benefit of higher ultrasonic vibration output power. Further, the excitation voltage to each layer may be reduced while maintaining the same output power. Again, the use of PVDF (and P(VDF-TrFE) in particular) are most preferred in producing the polymeric layers 102.

Figure 3A:
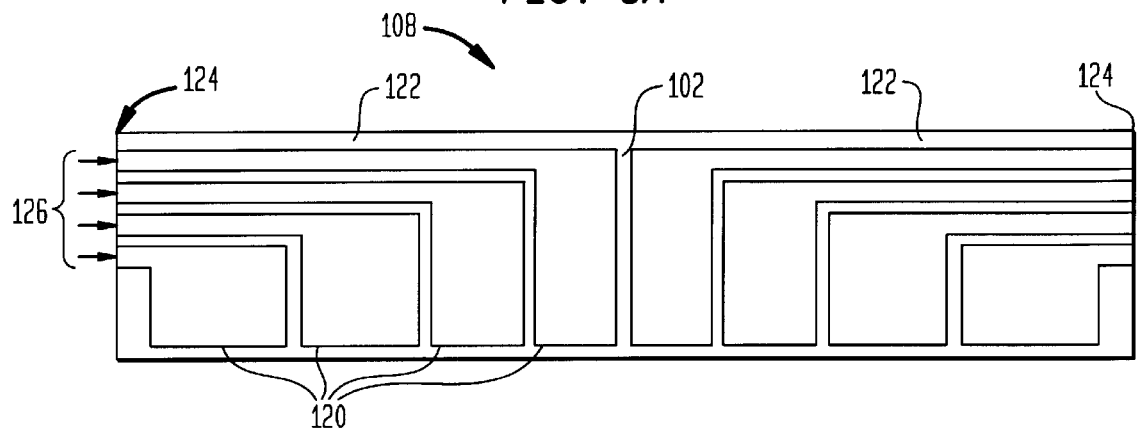
FIGS. 3a–3c are top plan views of signal layers which may be employed in the multi-layer piezoelectric transducer of FIG. 1.
Figure 3B:
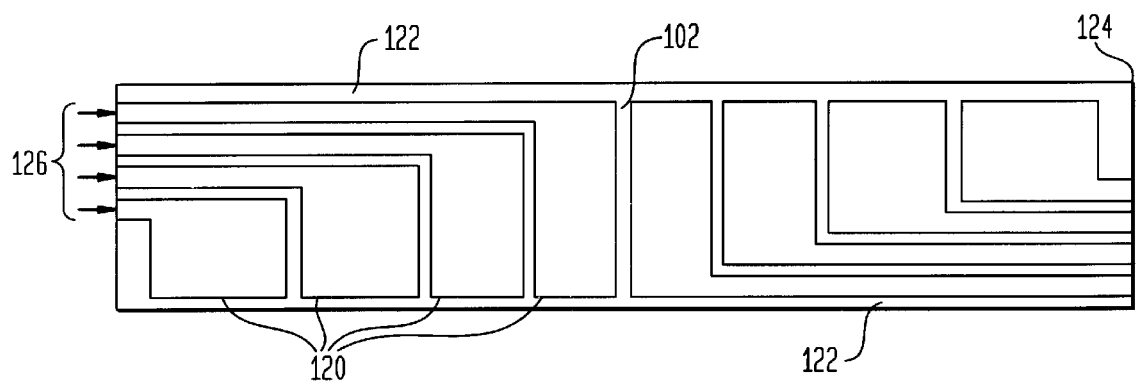
Figure 3C:
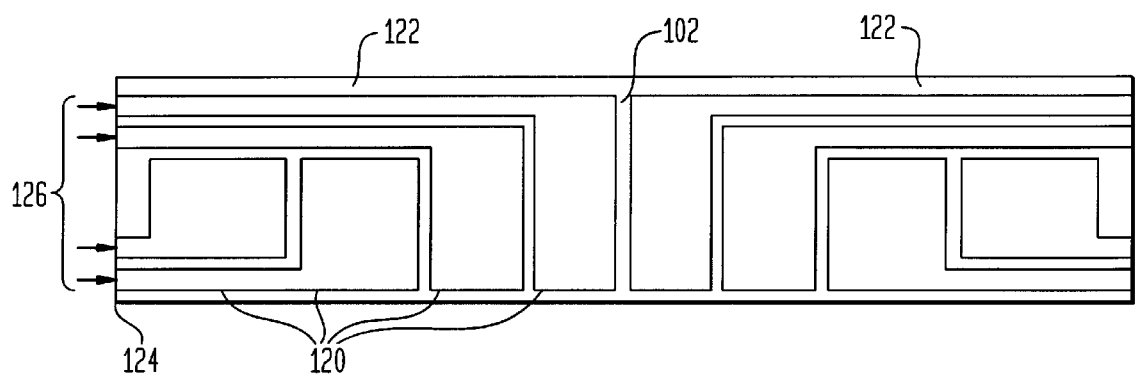

Preferably, the multi-layer piezoelectric transducers 100, 200 are formed as relatively thin strips or sheets. With reference to FIGS. 3a–3c, when the multi-layer piezoelectric transducers 100, 200 are formed as strips, the one or more signal layers 108a, 108b (collectively 108 for simplicity) comprise a plurality of separated signal electrodes 120 forming a signal layer array, here a one-dimensional array. Each signal electrode 120 is preferably capable of separate excitation. Separate excitation dictates separate electrical connection between respective signal electrodes 120 and an excitation source (not shown). A plurality of signal runs 122 extend from respective signal electrodes 120 to edges 124 of the polymeric layers 102 to achieve such electrical connection. Distal ends of the signal runs 122 preferably terminate at edge connectors 126 at the edges 124 of the polymeric layers 102. Suitable mating edge connectors (not shown) as are known in the art may be employed to conduct signal voltages to the signal runs 122 as will be apparent to skilled artisans from the teaching herein.

In some transducer arrays, it is preferred that all signal electrodes 120 in the array occupy substantially the same amount of area. Thus, length and width dimensions of adjacent signal electrodes 120 may differ so that the signal runs 122 may extend from respective signal electrodes 120 to the edges 124 of the polymeric layers 102. Various signal electrode patterns are illustrated in FIGS. 3a, 3b, and 3c, which achieve separate excitation of, separate electrical connection to, and equal area of, each signal electrode 120.

The signal electrodes 120, signal runs 122, and/or ground layers 104, 106, etc. may be disposed on the polymeric layers 102 using printed circuit techniques, such as by applying electrically conductive ink on the layers or by sputtering, electroless plating and/or electroplating. As these (and other) printed circuit techniques may be employed at relatively low cost, the piezoelectric transducers of the present invention may be produced efficiently and economically by taking advantage of these same (or substantially similar) techniques.

Figure 4:
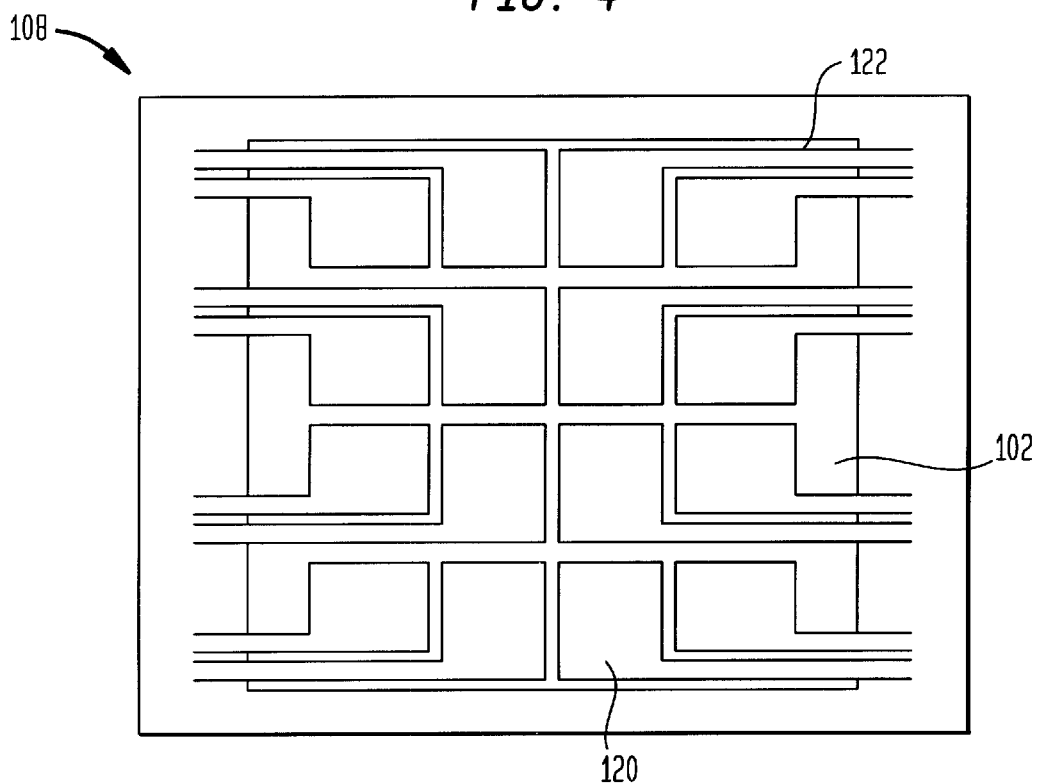
FIG. 4 is a top plan view of a signal layer array which is suitable for use in the multi-layer piezoelectric transducer of the present invention.

With reference to FIG. 4, when the multi-layer piezoelectric transducers 100, 200 are formed into relatively thin sheets, the signal layers 108 preferably include a plurality of separated signal electrodes 120 forming a signal layer array which is two-dimensional, such as a 4×4 array containing 16 signal electrodes 120. As was the case with the one-dimensional signal layer array (FIGS. 3a, 3b, 3c), the two-dimensional array of FIG. 4 employs a plurality of signal runs 122 extending from respective signal electrodes 120 to one or more edges 124 of the polymeric layer 102.

Figure 5:
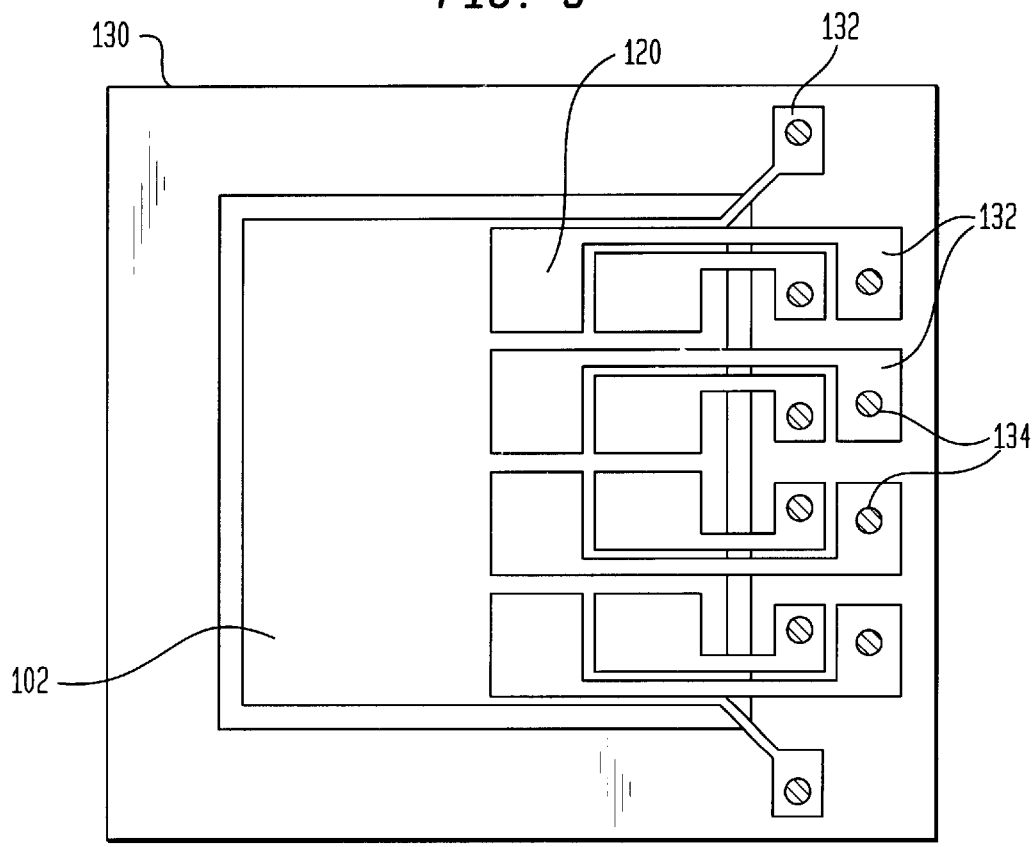
FIG. 5 is a top plan view of the signal layer array of FIG. 4 which includes connection terminals suitable for receiving alternating voltage at ultrasonic frequencies.

As best seen in FIG. 5, the multi-layer piezoelectric transducers 100, 200 may be disposed in a frame 130. The terminals 132 may be disposed about a periphery of the frame 130, where the terminals 132 are electrically connected to the respective signal runs 122. Preferably, the terminals 132 are in the form of electrode pads formed on one or more sections of a polymer board (such as mylar). Each pad preferably includes one or more bumps or pins 134 which are disposed in registration with corresponding electrodes of the excitation source (not shown). Thus, when the frame 130 is engaged with the excitation source, the bumps or pins 134 electrically communicate with the corresponding electrodes of the excitation source and signal voltage is delivered to the respective signal electrodes 120.

Figure 6:
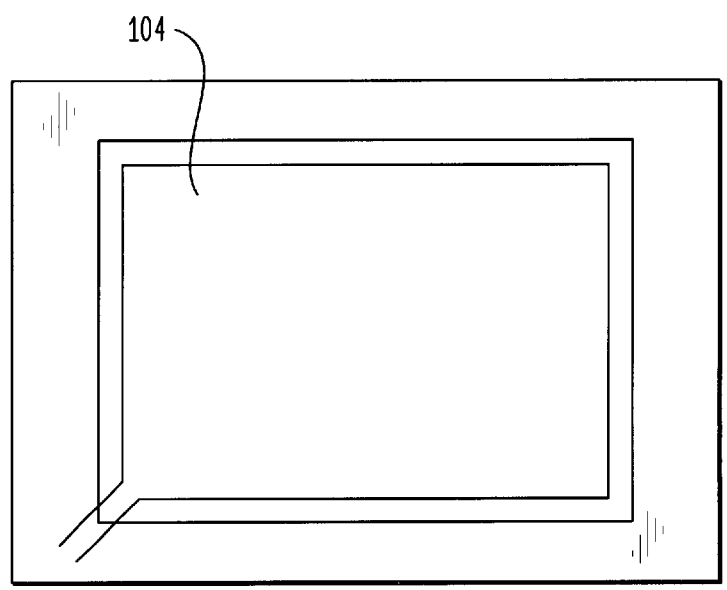
FIG. 6 is a top plan view of a preferred ground layer suitable for use in a multi-layer piezoelectric transducer employing the signal layer arrays of FIGS. 4 and 5.

With reference to FIG. 6, when the multi-layer piezoelectric transducer 100, 200 is formed into a relatively thin sheet as in FIGS. 4 and 5, the ground layers, 104, 106, 110, 112, etc. are preferably sized and shaped to cover an area substantially corresponding to the area of the signal layer array 108 (e.g., FIG. 4). It is preferred that the ground layers 104, 106, etc. are formed from a substantially continuous sheet of conductive material.

Figure 7:
FIG. 7 is a side sectional view of the multi-layer piezoelectric transducer of FIGS. 1 or 2, which has been formed into a curved shape.

Reference is now made to FIG. 7, which illustrates another aspect of the present invention where a piezoelectric transducer such as one of those discussed above with respect to FIGS. 1 and 2, is formed into a curved shape. It is noted that, in accordance with this aspect of the invention, the transducer need not be multi-layered, although the use of a multi-layered transducer is preferred. The curved piezoelectric transducer 300 includes an ultrasonic emission side at an inner (concave) portion 302 of the curve and a rear side 304.

Figure 8:
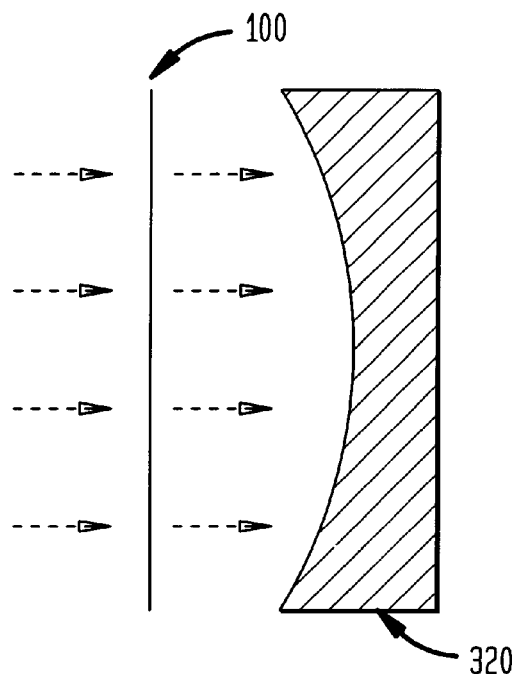
FIG. 8 is a side sectional view of a mold suitable for deforming a multi-layer piezoelectric transducer in accordance with the present invention.
Figure 9:
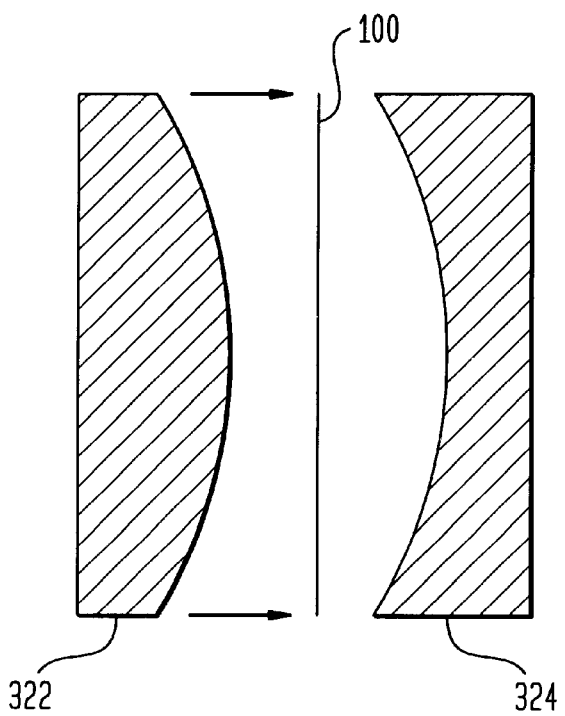
FIG. 9 is a side sectional view of an alternative mold suitable for deforming a multi-layer piezoelectric transducer in accordance with the present invention.

With reference to FIG. 8, the curved piezoelectric transducer 300 is preferably formed by first producing a substantially planar piezoelectric transducer and then plastically deforming the piezoelectric transducer into the curved shape illustrated in FIG. 7. Preferably, the deformation process includes plastic deformation and a fixing process whereby the deformed piezoelectric transducer retains the curved shape. As shown in FIG. 8, a curved mold 320 is preferably provided and the piezoelectric transducer (such as multi-layer transducer 100) is urged against the mold 320 such that the transducer deforms into the curved shape. Known methods of forming polymeric articles may be employed to urge the piezoelectric transducer against the curved mold 320. The use of pressurized gas (such as air) for pushing the transducer, or a vacuum to draw the transducer, is preferred. Alternatively, as shown in FIG. 9, complimentary curved mold halves 322, 324 (also referred to as matched molds) may be employed where the piezoelectric transducer (such as a multi-layer transducer 100) is located between the mold halves 322, 324 and the mold halves 322, 324 are drawn together to deform the transducer.

Fixing the deformed piezoelectric transducer into the curved shape may be achieved using any of the known techniques, where the use of thermal forming is preferred.

It is noted that an intermediate layer (or circuit panel) of material may be disposed between polymeric layers 102, on which intermediate layers the signal layer may be disposed. Thus, the signal electrodes 120 (FIGS. 3a–3c, 4, etc.) may be deposited on the intermediate layer of material and, thereafter, the polymeric layers may be bonded to the intermediate layer to form the multi-layer piezoelectric transducer. With such a structure, signal electrodes 120 may be disposed on opposing surfaces of the intermediate layer such that two signal layers are obtained between a pair of polymeric layers. When a multi-layer piezoelectric transducer employing the intermediate layer is to be curved in accordance with the invention, it is preferred that the intermediate layer be formed from a flexible, thermoformable material, such as a polymeric material like mylar, PET or PETG.

Figure 10:
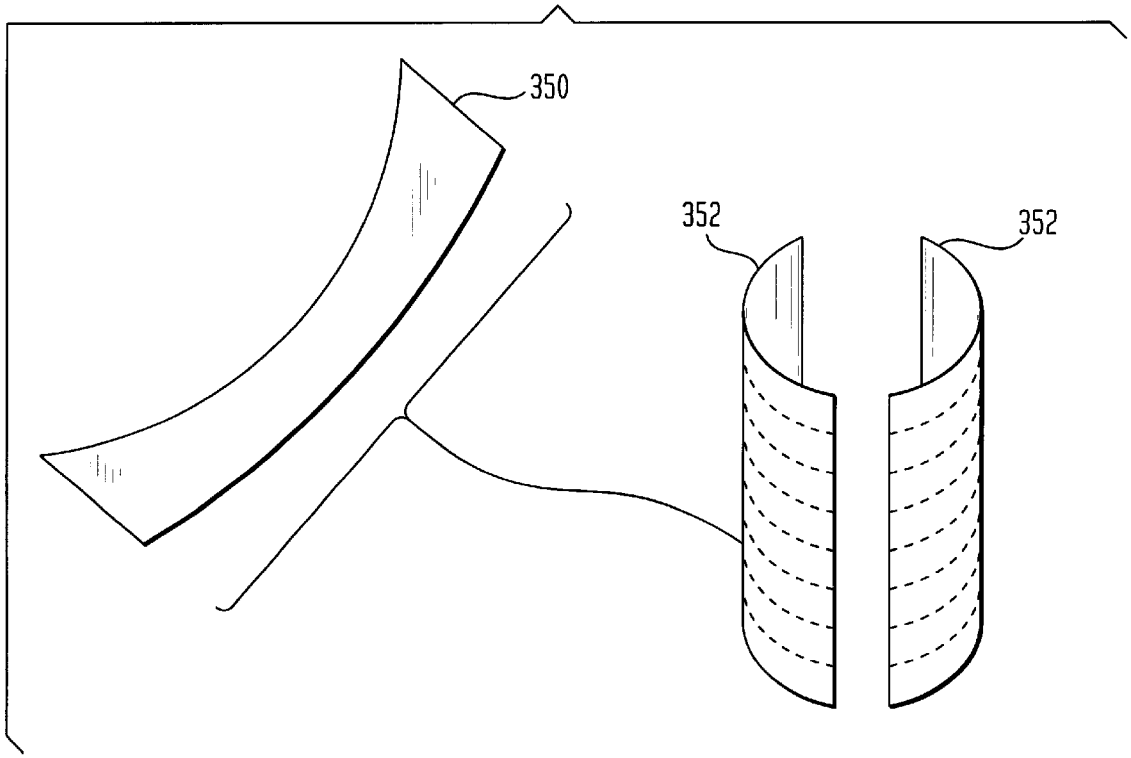
FIG. 10 is a perspective view of a plurality of multi-layer piezoelectric transducers configured as at least a partial cylinder.

With reference to FIG. 10, when the piezoelectric transducer 300 (of FIG. 7) is in the form of a strip 350, a plurality of such strips 350 may be disposed adjacent one another to produce one or more cylindrical portions 352 in order to achieve desirable ultrasonic focal characteristics. The molds of FIGS. 8 and/or 9 may be suitably sized and shaped to achieve the desired curved formation of the strip-shaped piezoelectric transducer 350 of FIG. 10.

Figure 11:
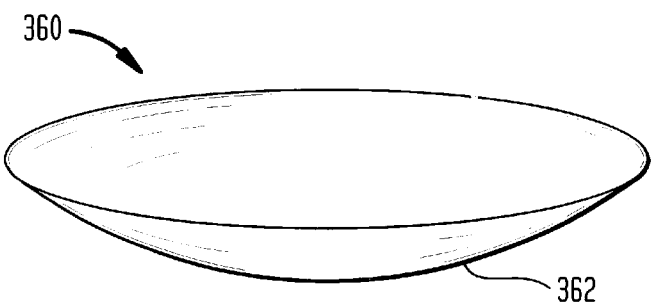
FIG. 11 is a perspective view of a multi-layer piezoelectric transducer formed into a dome.

With reference to FIG. 11, when the piezoelectric transducer of, for example, the multi-layer type disclosed in FIG. 1, is formed as a relatively thin sheet, the transducer 100 may be deformed into a dome-shaped piezoelectric transducer 360. The piezoelectric transducer 360 may be deformed utilizing properly sized and shaped molds, such as those illustrated in FIGS. 8 and/or 9. Again, the dome shape of the piezoelectric transducer 360 provides advantageous focusing of ultrasonic waves propagating from the transducer 360.

When a substantially flat and circular piezoelectric transducer is deformed into a domed shape, a difference in surface area is obtained due to stretching. When the diameter of the flat, circular piezoelectric transducer is about the same as a desired focal length of the later formed dome-shaped piezoelectric transducer, the surface area will stretch by about 7.2%. Thus, the layers of the transducer should be formed from materials which can stretch by about 7.2%. Often, the ground layers 104, 106 and signal layer(s) 108 will be formed from AlCu or Cu of about a 100 micron thickness. As AlCu and/or Cu may not stretch to 7.2%, ground layers 104, 106, etc. and/or signal layer(s) 108 may be formed from epoxy embedded with a conductive metal (such as silver).

Figure 12:
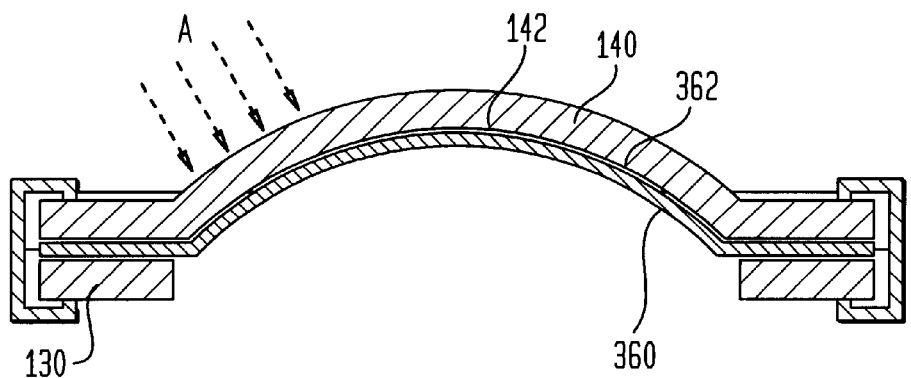
FIG. 12 is a side sectional view of the multi-layer piezoelectric transducer of FIG. 11, which includes additional structural elements.

With reference to FIG. 12, the piezoelectric transducer 360 is preferably disposed in communication with a shell (or backing) 140, which substantially covers the rear side 362 of the transducer 360. The shell 140 may be machined from suitable materials, such as aluminum, ceramic, or steel. The shell 140 may also be formed from a cured slurry of a suitable bonding material (hereinafter "epoxy"), tungsten, and a thermally conductive filler, such as at least one of boron nitride and silicon carbide. The slurry (prior to curing) is preferably applied to, and spread over, the rearward portion 362 of the transducer 360 such that it closely conforms to the dome shape. The slurry is then cured to form the shell 140. The cured slurry of the shell 140 is preferably in direct communication with the piezoelectric transducer 360.

The shell 140 may also be formed by spraying or painting molten alumina and/or ceramic on the rear side 362 of the piezoelectric transducer 360 as illustrated by arrows A in FIG. 12. When the molten alumina and/or ceramic hardens, the desired shell 140 will be obtained and, advantageously, suitable impedance mis-matching for substantial ultrasonic output power will be obtained.

Still further, shell 140 may be formed by providing a separately formed plate having an inner side and an outer side, where the epoxy, alumina, and/or ceramic is disposed on the outer side of the plate. The plate is then bonded to the transducer layers.

It is noted that the cured slurry, the alumina and/or ceramic, and/or the backing 140 (with or without the plate) may be utilized with a planar piezoelectric transducer, such as those shown in FIGS. 1 and 2. In either case, (i.e., whether the transducer is substantially flat or curved), a backing of alumina, silicon carbide and/or boron nitride, etc., is advantageously used to cool the transducer either passively or by way of forced fluid flow (e.g., air, water, etc.). Thus, the backing acts as a heatsink or cooling element.

Figure 13:
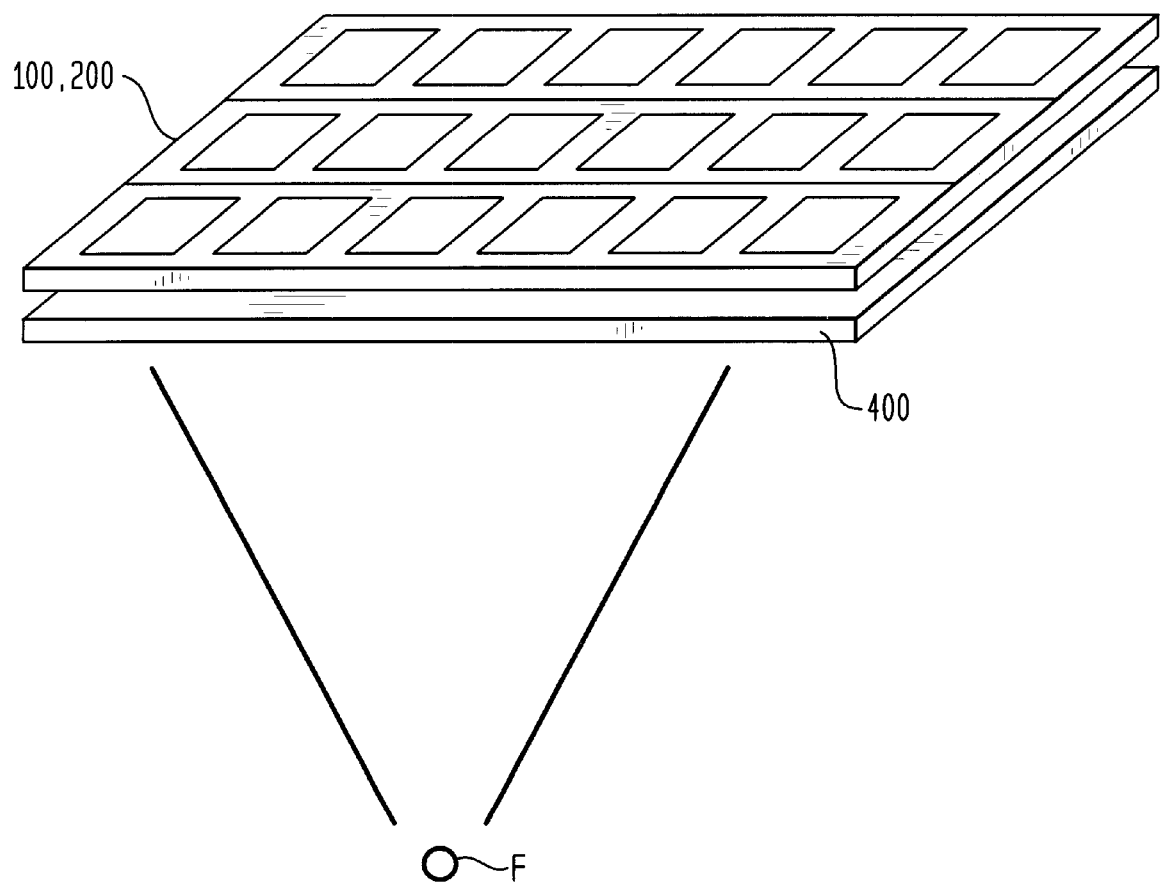
FIG. 13 is a multi-layer piezoelectric transducer, which employs a focusing lens in accordance with the present invention.

Reference is now made to FIG. 13, which illustrates another aspect of the present invention. A relatively planar multi-layer piezoelectric transducer, for example, of the type illustrated in FIGS. 1 and 2, is disposed proximate to a lens 400. The lens 400 is formed from a suitable plastic (e.g., polystyrene or PMMA) and sized and shaped in accordance with known techniques to achieve a focusing characteristic such that ultrasonic waves propagating through the lens 400 from the multi-layer piezoelectric transducer 100, 200 are focused substantially towards a single point, F. Advantageously, plastic deformation of the multi-layer piezoelectric transducer 100, 200 is not required inasmuch as the ultrasonic wave focusing function is achieved by way of the lens 400. Advantageously, manufacturing costs associated with deforming and fixing the multi-layer piezoelectric transducer 100, 200 into a domed shaped are avoided.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:
1. A multi-layer piezoelectric transducer, comprising:
   a first polymeric layer of piezoelectric material having spaced apart first and second surfaces;
   a second polymeric layer of piezoelectric material having spaced apart first and second surfaces;
   a first ground layer overlying the first surface of the first polymeric layer;

a second ground layer overlying the first surface of the second polymeric layer; and a signal layer sandwiched between the second surfaces of the first and second polymeric layers, the signal layer comprising a plurality of separated signal electrodes forming a signal layer array, each signal electrode being capable of separate excitation, wherein at least one of the first and second polymeric layers comprises a plurality of separate polymeric piezoelectric segments forming an array in substantial alignment with the signal layer array.

2. The multi-layer piezoelectric transducer of claim 1, wherein at least one of the polymeric layers are formed from polyvinylidene fluoride (PVDF).

3. The multi-layer piezoelectric transducer of claim 1, wherein at least one of the polymeric layers are formed from a co-polymer of PVDF.

4. The multi-layer piezoelectric transducer of claim 3, wherein the co-polymer of PVDF is PVDF and trifuoroethylene (TrFE).

5. The multi-layer piezoelectric transducer of claim 1, wherein the first ground layer is in direct contact with the first surface of the first polymeric layer.

6. The multi-layer piezoelectric transducer of claim 1, wherein the second ground layer is in direct contact with the first surface of the second polymeric layer.

7. The multi-layer piezoelectric transducer of claim 1, wherein at least one of the first and second ground layers are formed from a substantially continuous sheet of material.

8. The multi-layer piezoelectric transducer of claim 1, wherein the first and second ground layers are operable to connect to a neutral terminal of an excitation source and the signal layer is operable to connect to a hot terminal of the excitation source.

9. The multi-layer piezoelectric transducer of claim 1, wherein the signal layer is in direct contact with at least one of the second surfaces of the first and second polymeric layers.

10. The multi-layer piezoelectric transducer of claim 1, further comprising a focusing lens disposed forward of one of the first and second ground layers which is sized and shaped to focus ultrasonic sound waves emanating from the polymeric layers.

11. The multi-layer piezoelectric transducer of claim 1, wherein the transducer is substantially flat.

12. The multi-layer piezoelectric transducer of claim 1, wherein the signal layer array defines an outer periphery, the first and second ground layers define respective outer peripheries, and the respective outer peripheries of the signal layer array and the first and second ground layers are substantially aligned.

13. The multi-layer piezoelectric transducer of claim 1, further comprising a backing cast in a cured slurry of bonding material, tungsten, and a thermally conductive filler, the cured slurry being disposed at one of the first and second ground layers.

14. The multi-layer piezoelectric transducer of claim 13, wherein the bonding material is epoxy and the filler is taken from at least one of boron nitride and silicon carbide.

15. The multi-layer piezoelectric transducer of claim 1, further comprising:

a plate substantially overlying at least one of the first and second ground layers; and a cured slurry of bonding material, tungsten, and a thermally conductive filler, the cured slurry being disposed on the plate.

16. The multi-layer piezoelectric transducer of claim 15, wherein the bonding material is epoxy and the filler is taken from at least one of boron nitride and silicon carbide.

17. The multi-layer piezoelectric transducer of claim 1, further comprising:

a third polymeric layer of piezoelectric material having spaced apart first and second surfaces, the first surface of the third polymeric layer being in communication with the second ground layer such that the second ground layer is sandwiched between the first surfaces of the second polymeric layer and the third polymeric layer;

a fourth polymeric layer of piezoelectric material having spaced apart first and second surfaces;

a third ground layer in communication with the first surface of the fourth polymeric layer; and a second signal layer sandwiched between the second surfaces of the third and fourth polymeric layers.

18. A multi-layer piezoelectric transducer, comprising:

a first polymeric layer of piezoelectric material having spaced apart first and second surfaces;

a second polymeric layer of piezoelectric material having spaced apart first and second surfaces;

a first ground layer overlying the first surface of the first polymeric layer;

a second ground layer overlying the first surface of the second polymeric layer;

a signal layer sandwiched between the second surfaces of the first and second polymeric layers; and a backing material overlying one of the first and second ground layers wherein the backing material is operable to receive a cooling fluid to remove heat from the backing material.

19. The multi-layer piezoelectric transducer of claim 18, wherein the backing material is formed from at least one of: alumina; silicon carbide; boron nitride; steel; ceramic; metal; and a cured slurry of bonding material, tungsten, and a thermally conductive filler.

20. The multi-layer piezoelectric transducer of claim 19, wherein backing material is a plate on which at least one of the alumina; silicon carbide; boron nitride; steel; ceramic; and a cured slurry of bonding material tungsten, and a thermally conductive filler is disposed.

21. The multi-layer piezoelectric transducer of claim 18, further comprising a focusing lens disposed forward of one of the first and second ground layers which is sized and shaped to focus ultrasonic sound waves emanating from the polymeric layers.

22. The multi-layer piezoelectric transducer of claim 18, wherein the cooling fluid is at least one of air and water.

23. A multi-layer piezoelectric transducer, comprising:

a first polymeric layer of piezoelectric material having spaced apart first and second surfaces;

a second polymeric layer of piezoelectric material having spaced apart first and second surfaces;

a first ground layer overlying the first surface of the first polymeric layer;

a second ground layer overlying the first surface of the second polymeric layer;

a signal layer sandwiched between the second surfaces of the first and second polymeric layers; and a plurality of curved strips disposed adjacent to one another to form at least a partial cylinder, wherein:

the first and second polymeric layers, the first and second ground layers, and the signal layer form at least one of the curved strips having an ultrasonic emission side and a rear side; and one of the first and second ground layers is located at the emission side and the other of the first and second ground layers is located at the rear side.

24. A piezoelectric transducer, comprising:
a polymeric layer of piezoelectric material having spaced apart first and second surfaces;
a ground layer overlying the first surface of the polymeric layer;
a backing material overlying the ground layer wherein the backing material is operable to receive a cooling fluid to remove heat from the backing material; and
a signal layer overlying the second surface of the polymeric layer, wherein
the polymeric layer, the ground layer, and the signal layer form a curved shape having an ultrasonic emission side and a rear side portion, and
the ground layer is disposed at the rear side of the curved shape.

25. The piezoelectric transducer of claim 24, wherein the curved shape is a dome.

26. The piezoelectric transducer of claim 24, further comprising a backing cast in a cured slurry of bonding material, tungsten, and a thermally conductive filler, the cured slurry being disposed on the rear side of the curved shape.

27. The piezoelectric transducer of claim 26, wherein the bonding material is epoxy and the filler is taken from at least one of boron nitride and silicon carbide.

28. The piezoelectric transducer of claim 24, wherein the backing material is formed from at least one of: alumina; silicon carbide; boron nitride; steel; ceramic; metal; and a cured slurry of bonding material, tungsten, and a thermally conductive filler.

29. The piezoelectric transducer of claim 28, wherein backing material is a plate on which at least one of the alumina; silicon carbide; boron nitride; steel; ceramic; and a cured slurry of bonding material, tungsten, and a thermally conductive filler is disposed.

30. The piezoelectric transducer of claim 29, wherein the cooling fluid is at least one of air and water.

31. The piezoelectric transducer of claim 26, further comprising a plate overlying the rear side of the curved shape, the plate including a backing having a cured slurry of bonding material, tungsten, and a thermally conductive filler.

32. The piezoelectric transducer of claim 31, wherein the bonding material is epoxy and the filler is taken from at least one of boron nitride and silicon carbide.

33. The piezoelectric transducer of claim 26, further comprising:
a plate substantially overlying the rear side of the curved shape; and
a cured slurry of bonding material, tungsten, and a thermally conductive filler, the cured slurry being disposed on the plate.

34. The piezoelectric transducer of claim 33, wherein the bonding material is epoxy and the filler is taken from at least one of boron nitride and silicon carbide.

35. A multi-layer piezoelectric transducer, comprising:
a first polymeric layer of piezoelectric material having spaced apart first and second surfaces;
a second polymeric layer of piezoelectric material having spaced apart first and second surfaces;
a first ground layer overlying the first surface of the first polymeric layer;
a second ground layer overlying the first surface of the second polymeric layer;
a signal layer sandwiched between the second surfaces of the first and second polymeric layers, the signal layer comprising a plurality of separated signal electrodes forming a signal layer array, each signal electrode being capable of separate excitation;
wherein the first and second polymeric layers, the first and second ground layers, and the signal layer form a dome having an ultrasonic emission side and a rearward portion,
one of the first and second ground layers is located at the rearward portion of the dome and the transducer further includes a backing material overlying the one of the first and second ground layers, and the backing material is operable to receive a cooling fluid to remove heat from the backing material.

36. The multi-layer piezoelectric transducer of claim 35, wherein the polymeric layers are formed from polyvinylidene fluoride (PVDF).

37. The multi-layer piezoelectric transducer of claim 35, wherein the polymeric layers are formed form a co-polymer of PVDF.

38. The multi-layer piezoelectric transducer of claim 37, wherein the co-polymer of PVDF is PVDF and trifuoroethylene (TrFE).

39. The multi-layer piezoelectric transducer of claim 35, wherein the backing material is a cast of a cured slurry of bonding material, tungsten, and a thermally conductive filler, the cured slurry being disposed on the rearward portion of the dome.

40. The multi-layer piezoelectric transducer of claim 39, wherein the bonding material is epoxy and the filler is taken from at least one of boron nitride and silicon carbide.

41. The multi-layer piezoelectric transducer of claim 35, further comprising a plate substantially overlying the rear side of the dome; and
a cured slurry of bonding material, tungsten, and a thermally conductive filler, the cured slurry being disposed on the plate.

42. The multi-layer piezoelectric transducer of claim 41, wherein the bonding material is epoxy and the filler is taken from at least one of boron nitride and silicon carbide.

43. The multi-layer piezoelectric transducer of claim 35, further comprising at least one of alumina and ceramic material disposed at the rear side of the dome.

44. The multi-layer piezoelectric transducer of claim 35, further comprising at least one of steel and metal material disposed at the rear side of the dome.

* * * * *

UNITED STATES PATENT AND TRADEMARK OFFICE
CERTIFICATE OF CORRECTION

PATENT NO. : 6,492,762 B1
DATED : December 10, 2002
INVENTOR(S) : Bharat B. Pant et al.

It is certified that error appears in the above-identified patent and that said Letters Patent is hereby corrected as shown below:

<u>Column 11,</u>
Line 40, "claim 29" should read -- claim 24 --.

Signed and Sealed this

Fifteenth Day of July, 2003

JAMES E. ROGAN
*Director of the United States Patent and Trademark Office*